(12) United States Patent
Kim et al.

(10) Patent No.: US 7,811,147 B2
(45) Date of Patent: Oct. 12, 2010

(54) ORGANIC ELECTROLUMINESCENT DEVICE AND FABRICATION METHOD THEREOF

(75) Inventors: Jeong Hyun Kim, Gunpo-si (KR); Jae Yoon Lee, Seoul (KR); Choong Keun Yoo, Anyang-si (KR); Heung Lyul Cho, Suwon-si (KR); Kang Ju Lee, Ansan-si (KR); Se Young Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 457 days.

(21) Appl. No.: 11/819,316

(22) Filed: Jun. 26, 2007

(65) Prior Publication Data

US 2008/0203904 A1    Aug. 28, 2008

(30) Foreign Application Priority Data

Feb. 26, 2007   (KR)  .......................... P2007-018843

(51) Int. Cl.
*H01J 9/26* (2006.01)
*H01J 9/32* (2006.01)

(52) U.S. Cl. .......................... 445/25; 313/512; 313/504

(58) Field of Classification Search .................. 445/24, 445/25, 43, 253; 313/504, 512; 349/190; 277/628
See application file for complete search history.

(56) References Cited

U.S. PATENT DOCUMENTS

| | | | |
|---|---|---|---|
| 6,354,899 B1 * | 3/2002 | Moore | 445/25 |
| 7,110,080 B2 * | 9/2006 | Matsumoto | 349/155 |
| 7,112,115 B1 * | 9/2006 | Yamazaki et al. | 445/25 |
| 7,514,280 B2 * | 4/2009 | Lee | 438/28 |
| 2005/0139844 A1 * | 6/2005 | Park et al. | 257/82 |
| 2007/0170860 A1 * | 7/2007 | Choi et al. | 313/512 |
| 2007/0200496 A1 * | 8/2007 | Cok et al. | 313/512 |
| 2007/0222384 A1 * | 9/2007 | Yonemoto | 313/512 |

FOREIGN PATENT DOCUMENTS

| | | |
|---|---|---|
| JP | 2004-006343 | 1/2004 |
| JP | 2005-222807 | 8/2005 |
| JP | 2006-156403 | 6/2006 |
| JP | 2006-164972 | 6/2006 |
| JP | 2007-200844 | 8/2007 |
| KR | 2005-0067253 | 7/2005 |

\* cited by examiner

*Primary Examiner*—Peter J Macchiarolo
*Assistant Examiner*—Glenn Zimmerman
(74) *Attorney, Agent, or Firm*—McKenna Long & Aldridge LLP

(57) ABSTRACT

Provided are an organic electroluminescent device and a fabrication method thereof. The organic electroluminescent device includes a first substrate, a second substrate, an organic electroluminescent layer formed on the first substrate, a thin film transistor formed on the second substrate, and first and second seal lines attaching the first and second substrates to each other.

7 Claims, 13 Drawing Sheets

ORGANIC ELECTROLUMINESCENT DEVICE AND FABRICATION METHOD THEREOF

This application claims the benefit of Korean Patent Application No. 10-2007-0018843, filed on Feb. 26, 2007, which is hereby incorporated by reference for all purposes as if fully set forth herein.

BACKGROUND OF THE INVENTION

1. Field of the Invention

The present invention relates to an organic electroluminescent device, and more particularly, to an organic electroluminescent device for improving the attachment characteristic of upper and lower substrates and preventing the penetration of external moisture, and a fabrication method thereof.

2. Description of the Related Art

In recent years, many attempts to improve the display quality of flat panel displays and provide large-sized displays have been made actively. Among them, an electroluminescent device is self-luminous and displays video image by exciting fluorescent material using carriers such as electrons and holes. The electroluminescent device is mainly classified into an inorganic electroluminescent device and an organic electroluminescent device. While the inorganic electroluminescent device requires a high voltage of 100-200V, the organic electroluminescent device can be driven at a low DC voltage of 5-20V.

FIG. 1 is a schematic sectional view of a related art bottom emission type organic electroluminescent device. Specifically, FIG. 1 illustrates a sectional view of an active matrix light emitting diode (AMOLED) that operates in bottom emission fashion. For the sake of illustrative convenience, one pixel region consisting of a red (R) sub pixel, a green (G) sub pixel, and a blue (B) sub pixel is representatively shown in FIG. 1.

Referring to FIG. 1, first and second substrates 10 and 30 are arranged to face each other. A thin film transistor T and a first electrode 12 are formed on a transparent substrate 1 of the first substrate 10 in each sub pixel. An organic electroluminescent layer 14 exhibiting red, green and blue color is formed on the thin film transistor T and the first electrode 12. A second electrode 16 is formed on the organic electroluminescent layer 14. The first and second electrodes 12 and 16 playing a role in applying an electric field to the organic electroluminescent layer 14. The first substrate 10 where the organic electroluminescent layer 14 is formed is attached to the second substrate 30 by means of a seal 40.

In the bottom emission type structure, when the first electrode 12 and the second electrode 16 are respectively used as an anode and a cathode, the first electrode 12 is formed of a transparent conductive material and the second electrode 16 is formed of a metallic material having a low work function. Under this condition, the organic electroluminescent layer 14 includes a hole injection layer 14a, a hole transporting layer 14b, an emission layer 14c, an electron transporting layer 14d, and an electron injection layer 14e, which are sequentially formed on the first electrode 12.

In the emission layer 14c, light-emitting materials taking on red, green and blue colors are arranged in each sub pixel. Like this, since the first and second substrates 10 and 30 are attached to each other by means of a single seal line, the related art organic electroluminescent device has a problem that it is susceptible to moisture and foreign substance penetrated from the outside.

SUMMARY OF THE INVENTION

Accordingly, the present invention is directed to an organic electroluminescent device and a fabrication method thereof that substantially obviate one or more problems due to limitations and disadvantages of the related art.

An object of the present invention is to provide an organic electroluminescent device preventing the penetration of external moisture and foreign substance by dually forming seal lines of which one is used for attaching upper and lower substrates and the other is used for closing off edge regions at both sides of the attached upper and lower substrates from the outside, and a fabrication method of the organic electroluminescent device.

Another object of the present invention is to provide an organic electroluminescent device in which dual seals can be formed without modification of a bezel region by attaching upper and lower substrates of the organic electroluminescent device by means of a first seal line, removing a portion of edges at both sides of one of the attached upper and lower substrates, and forming a second seal line on edges at both sides of the attached upper and lower substrates.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided an organic electroluminescent device including: a first substrate; a second substrate; an organic electroluminescent layer formed on the first substrate; a thin film transistor formed on the second substrate; and first and second seal lines attaching the first and second substrates to each other.

In another aspect of the present invention, there is provided a method of fabricating an organic electroluminescent device, the method including: providing a first substrate; providing a second substrate; coating a sealant on one of the first and second substrates, and attaching the first and second substrates to each other to form a first seal line; and forming a second seal line on edge regions at both sides of the attached first and second substrates where the first seal line is formed.

In further another aspect of the present invention, there is provided a method of fabricating an organic electroluminescent device, the method including: attaching first and second substrates to each other, the first and second substrates having a plurality of active regions; cutting the attached first and second substrates into active region units; and forming a seal line on edge regions at both sides of the first and second substrates that are cut into the active region units.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2H are sectional views illustrating a method of fabricating an organic electroluminescent device according to the present invention.

Figure 1:
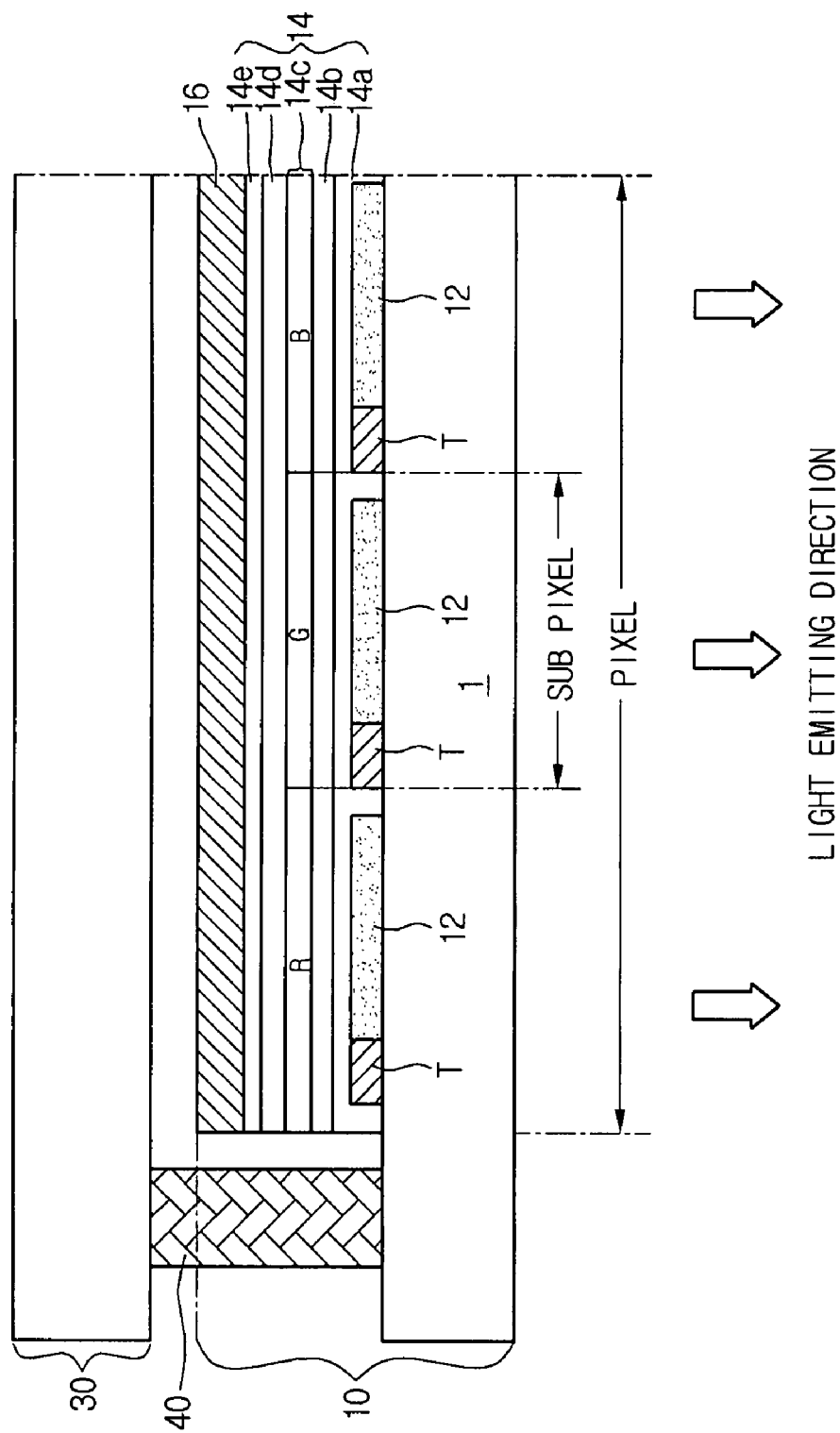
FIG. 1 is a schematic sectional view of a related art bottom emission type organic electroluminescent device.
Figure 2A:
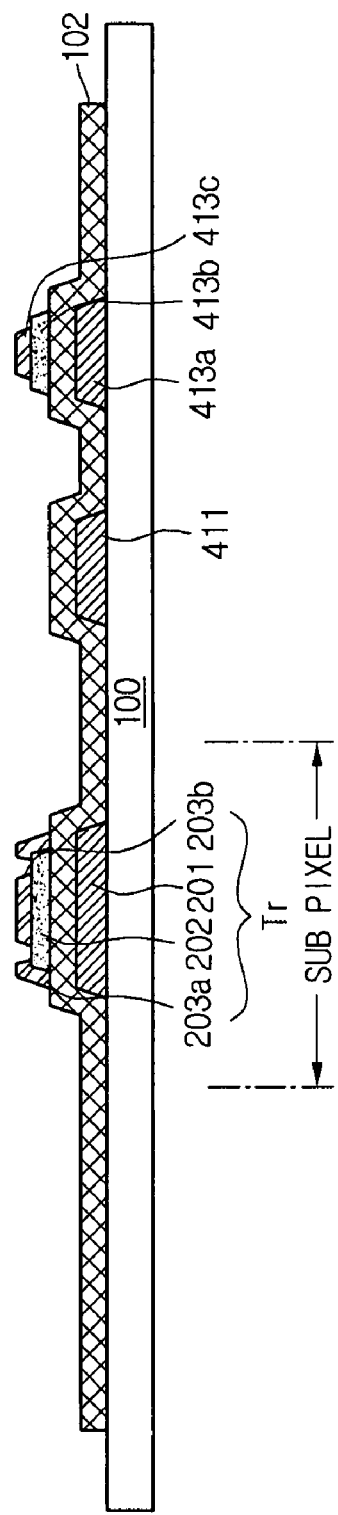
FIGS. 2A to 2H are sectional views illustrating a method of fabricating an organic electroluminescent device according to the present invention.

Referring to FIG. 2A, a metal layer is formed on a first insulating substrate 100, and thereafter a gate electrode 201, a power line 411 and a first dummy pattern 413a are formed. Here, the metal layer may employ AlNd layer or a double metal layer of AlNd and Mo.

Thereafter, a gate insulating layer 102 is formed on an entire surface of the first insulating substrate 100. Subsequently, an amorphous silicon layer and a metal layer are formed on an entire surface of the first insulating substrate 100. Afterwards, an etching is performed using diffraction mask or halftone mask process to simultaneously form source/drain electrodes 203a and 203b, an active layer 202 provided with an ohmic contact layer and a channel layer, and a data line (not shown). Examples of a material that may be used for a metal layer include Mo, Mo ally, Cu, and Cu alloy.

Second and third dummy patterns 413b and 413c, which corresponds to the active layer and the source/drain metal layer, respectively, are formed on the first dummy pattern 413a. A mask process of forming the active layer 202 and a mask process of forming the source/drain electrodes 203a and 203b may be respectively performed without using a diffraction mask or a halftone mask.

Figure 2B:
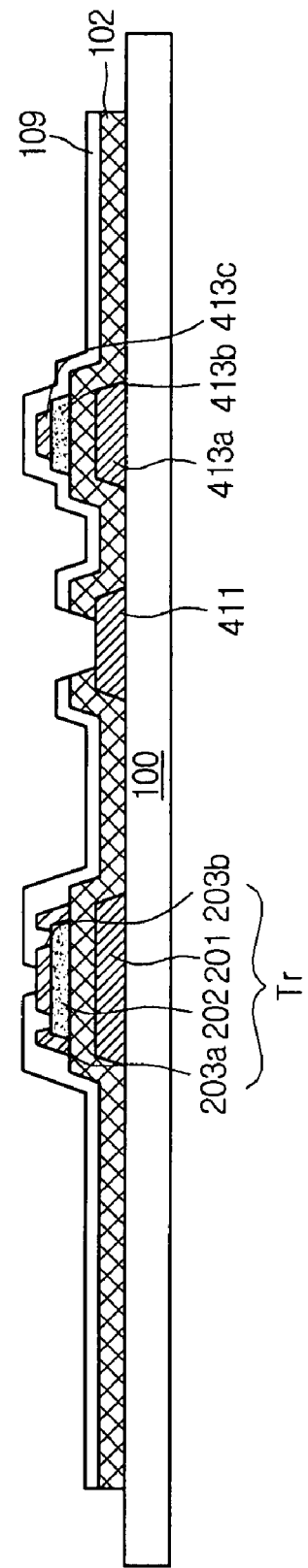

After forming a thin film transistor Tr configured with the gate electrode 201, the active layer 202, and the source/drain electrodes 203a and 203b, a passivation layer 109 is formed on an entire surface of the first insulating substrate 100, as illustrated in FIG. 2B. Thereafter, a contact hole process is performed by photolithography process including a mask process to expose a portion of the drain electrode 203b and a portion of the power line 411. Although not shown in FIG. 2B, the passivation layer 109 formed over a gate pad region and a data pad region is also etched to expose portions of gate and data pads.

Figure 2C:
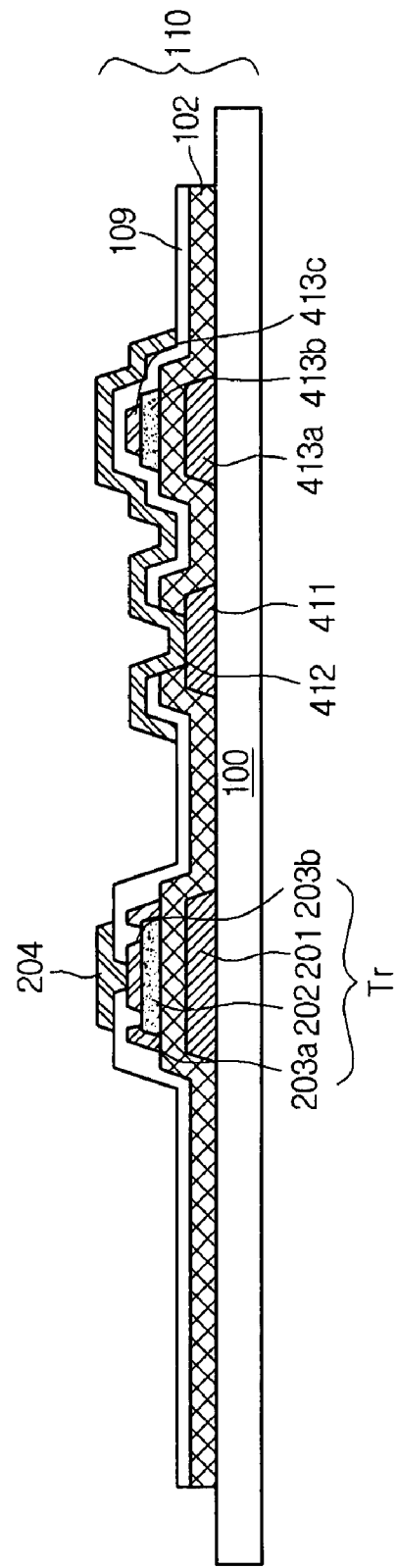

After completing the contact hole process over the passivation layer 109, a metal layer is formed on the first insulating substrate 100, as illustrated in FIG. 2C. Afterwards, the metal layer is patterned into a predetermined configuration to thereby form a contact 204 and a power electrode 412, wherein the contact 204 is electrically connected to the drain electrode 203b, and the power electrode 412 is electrically connected to the power line 411.

Figure 2D:
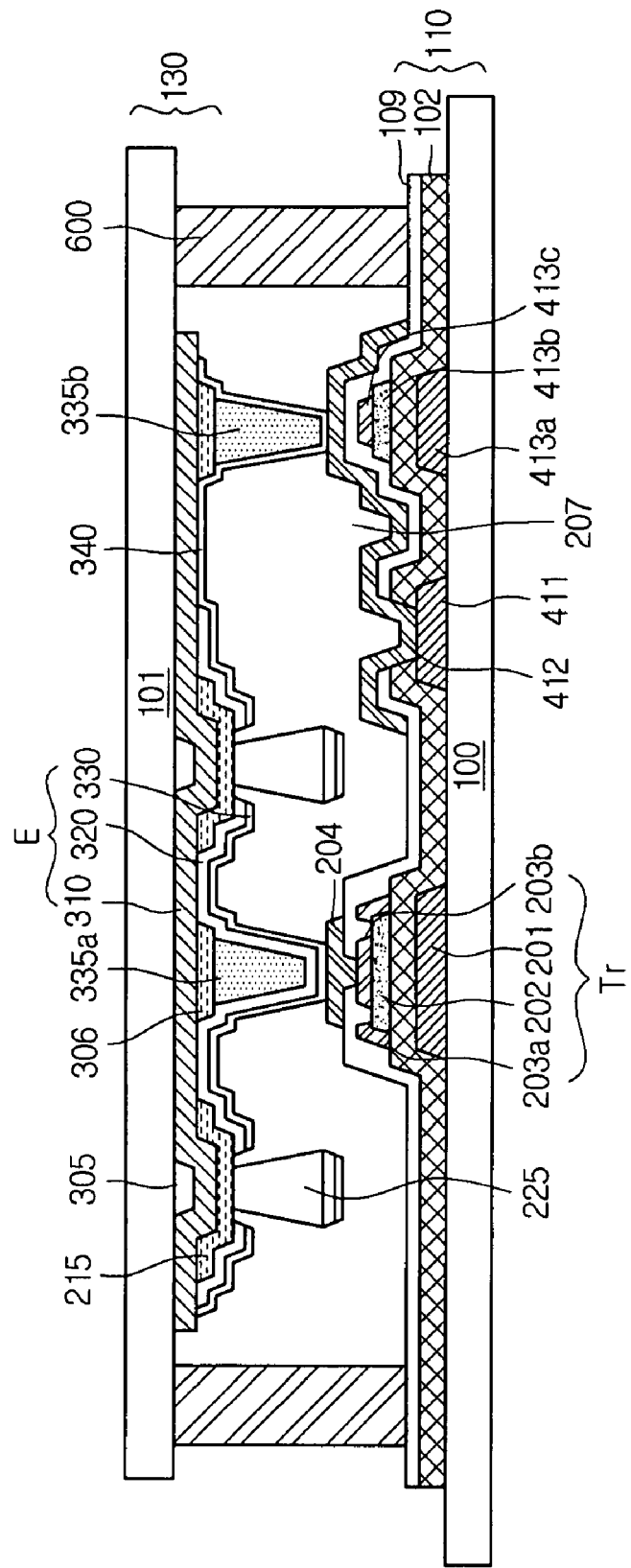

After completing a lower substrate 110 of the organic electroluminescent device through the above-described processes, an attachment process is performed to attach an upper substrate 130 having an organic electroluminescent layer to the lower substrate 110 correspondingly, as illustrated in FIG. 2D.

In the upper substrate 130, a bus line (auxiliary electrode) 305 formed of conductive metal pattern is formed on a second insulating substrate 101, and a first electrode 310 is formed on the second insulating substrate 101 where the bus line 305 is formed.

Over the second insulating substrate 101 where the first electrode 310 is formed, each of sub pixel regions is partitioned by a first buffer layer 215 and a partition wall 225 formed on the first buffer layer 215. In addition, a second buffer layer 306, and first and second column spacers 335a and 335b on the second buffer layer 306 are formed for electrically connecting an electrode of the upper substrate 130 to the thin film transistor Tr of the lower substrate 110.

In the sub pixel region, the first electrode 310 is exposed, and an organic electroluminescent layer 320 is formed on the exposed first electrode 310. In addition, a second electrode 330 is formed on the electroluminescent layer 320. Thus, the first electrode 310, the organic electroluminescent layer 320, and the second electrode 330 constitutes an organic electroluminescent diode E.

The organic electroluminescent layer may be formed as red (R), green (G) and blue (B) organic electroluminescent layers. The organic electroluminescent layer formed in each sub pixel unit may be structured such that R, G and B organic electroluminescent layers are stacked to generate white light. In case of the stacked structure of R, G and B organic electroluminescent layers, R, G and B color filters may be further formed on the lower substrate in each sub pixel unit. Alternatively, the organic electroluminescent layer may be formed as a single layered white organic electroluminescent layer. In this case, R, G and B color filters may also be further formed on the lower substrate in each sub pixel unit. Herein, the organic electroluminescent device has a bottom emission type that light of the organic electroluminescent layer is emitted toward the lower substrate 110.

The contact electrode 340 formed on the second column spacer 335b and the first electrode 310 are electrically connected to the power line 411 and the power electrode 412 of the lower substrate 110 receiving the power voltage. Therefore, the power voltage can be supplied to the upper substrate 130 from the lower substrate 110. At this point, the contact electrode 340 is patterned at the same time when the second electrode 330 is formed.

After forming the upper and lower substrates 130 and 110, a sealant is coated on one of the upper and lower substrates 130 and 110, and thereafter the upper and lower substrates 130 and 110 are attached to each other. Afterwards, sealant-hardening process is performed, i.e., ultraviolet (UV) light is irradiated on the sealant, thereby forming a first seal line 600. The first seal line 600 is located at the outside of an active region formed the organic electroluminescent layer.

Here, the first insulating substrate 100 of the lower substrate 110 extends further in both lateral directions than the second insulating substrate 101 of the upper substrate 130 in order to form a second seal line on edge regions at both sides of the upper and lower substrates 130 and 120 attached by the first seal line 600. On occasion demands, the edge regions at both sides of the second insulating substrate 101 of the upper substrate 130 may be reduced so that the second insulating substrate 101 may be formed narrower than the width of the first insulating substrate 100 of the lower substrate 110.

A method of forming the widths of the upper and lower substrates 130 and 110 differently will be illustrated below. Sub pixels are arranged in a matrix to form a plurality of active regions (display regions) on the first and second insulating substrates 100 and 101 which are bare glass substrates.

The attached upper and lower substrates 130 and 110 having the plurality of active regions are cut into active region units. Here, a cut region for one of the upper and lower substrates 130 and 110 is made wide or narrow with respect to the active region so that the upper and lower substrates 130 and 110 have different widths from each other.

Figure 2E:
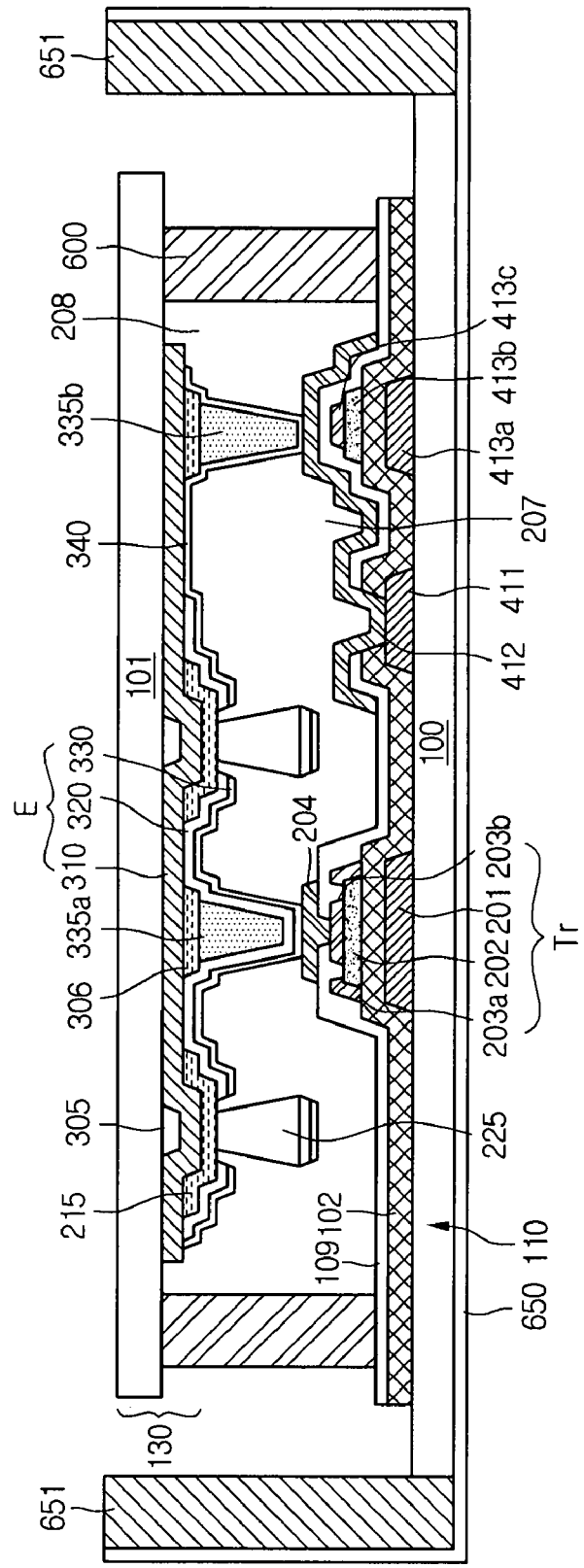

After cutting the attached upper and lower substrates 130 and 110 as described above, a supporter 650 is attached to a rear surface of the lower substrate 110, as illustrated in FIG. 2E. Examples of a material that may be used as the supporter 650 include metal, plastic material, etc. A guide member 651 may be additionally disposed at edge regions at both sides of the supporter 650.

However, depending on circumstances, the guide member 651 is attached to the edge regions at both sides of the attached upper and lower substrates 130 and 110, and thereafter the supporter 650 may be attached to the rear surface of the lower substrate 110.

Figure 2F:
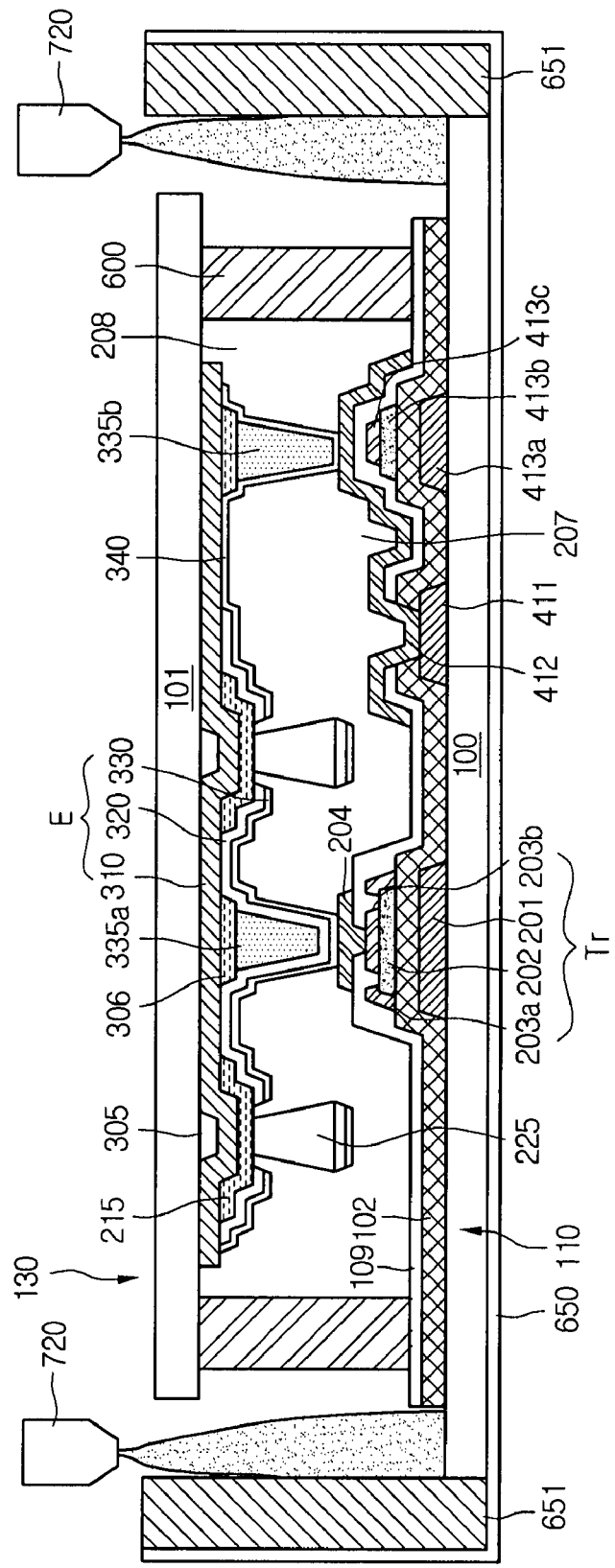

After attaching the supporter 650 and the guide member 651 to the rear surface of the lower substrate 110 as described above, a sealant is coated on the edge regions at both sides of the attached upper and lower substrates 130 and 110 using a dispenser 720, as illustrated in FIG. 2F. Therefore, the edge regions at both sides of the attached upper and lower substrates 130 and 110 are filled with the coated sealant. Examples of a material that may be used as the sealant include silicon-based inorganic material, metal oxide, and UV curing agent.

Figure 2G:
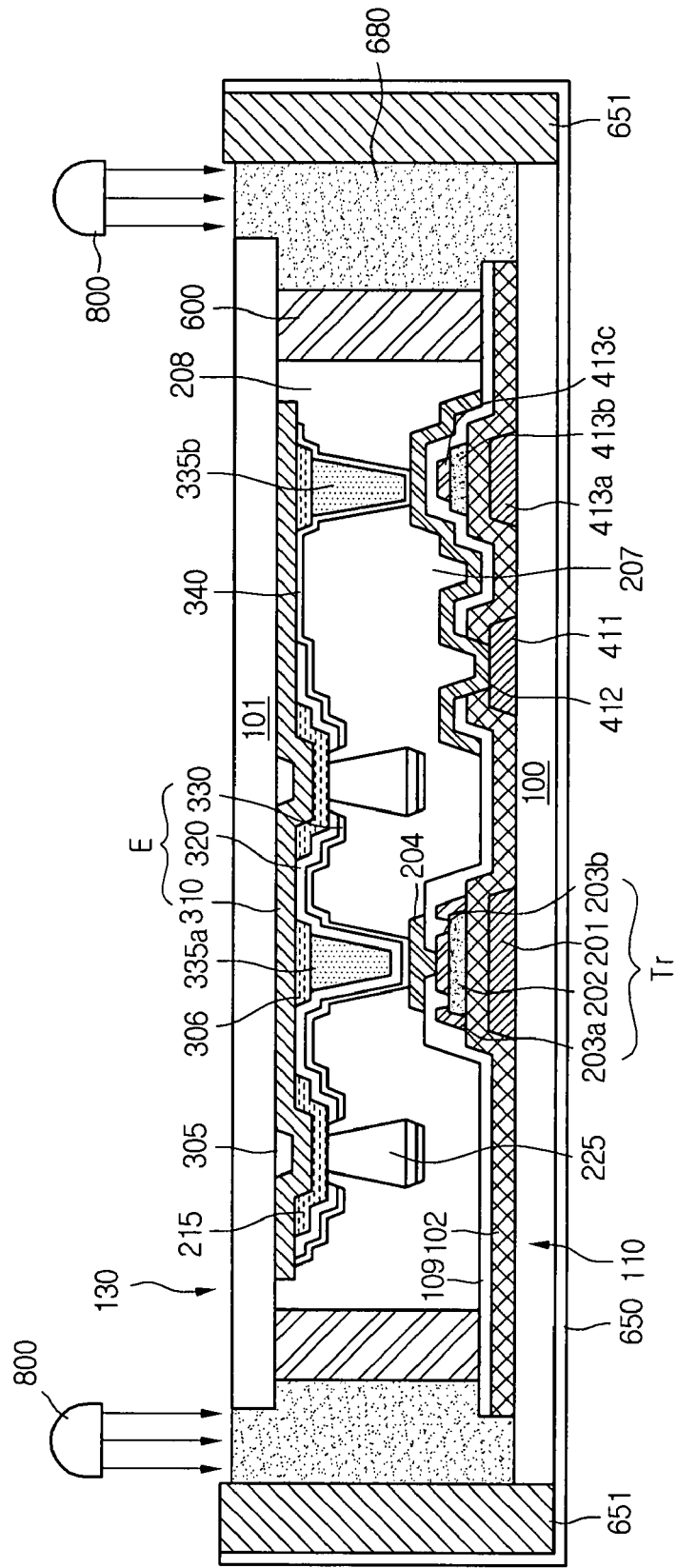

Afterwards, referring to FIG. 2G, a UV irradiator 800 is positioned over the edge regions at both sides of the attached upper and lower substrates 130 and 110, and a curing process is then performed to thereby form a second seal line 680. This second seal line 680 plays a role in sealing off the attached upper and lower substrates 130 and 10 at both edges thereof In addition, in case of using the UV irradiator 800, a mask may be used such that UV light is irradiated on only the attached upper and lower substrates 130 and 10.

Also, when an inorganic material is used for the second seal line, the curing process may be performed using a beam heater or a laser.

Figure 2H:
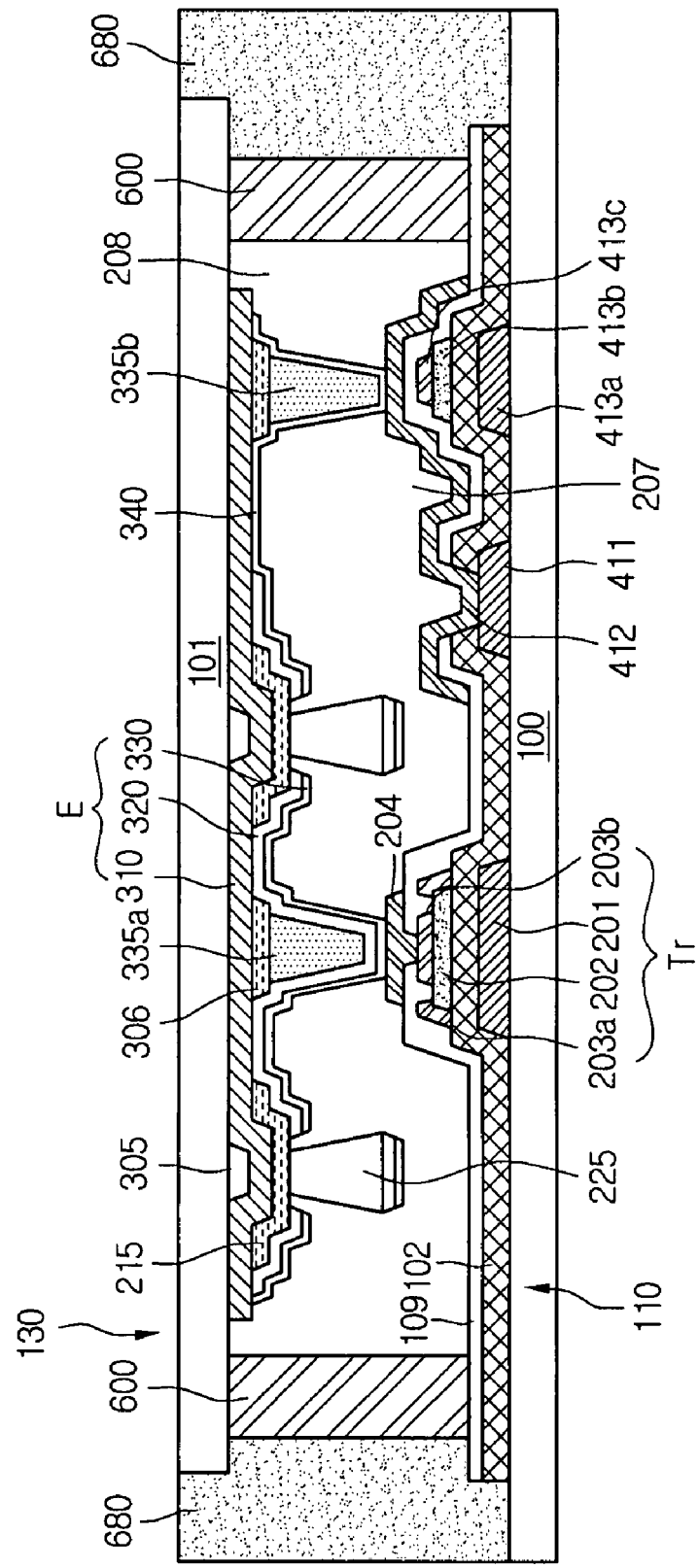

After forming the second seal line 680 as described above, the supporter 650 and the guide member 651 are removed to complete the organic electroluminescent device, as illustrated in FIG. 2H.

In the present invention, the fabrication yield of the organic electroluminescent device can be improved by forming the organic electroluminescent layer and the thin film transistor on the lower substrate and the upper substrate, respectively.

Furthermore, the dual seal lines are employed when attaching the upper and lower substrates to each other so that it is possible to minimize the penetration of external moisture or the decrease of degree of vacuum inside the substrate, which results in improving device characteristics. Moreover, it is unnecessary to additionally form a bezel region on the edge regions at both sides of the attached upper and lower substrates in virtue of the dual seal lines.

FIGS. 3A to 3D are sectional views illustrating a method of fabricating an organic electroluminescent device according to another embodiment of the present invention.

Figure 3A:
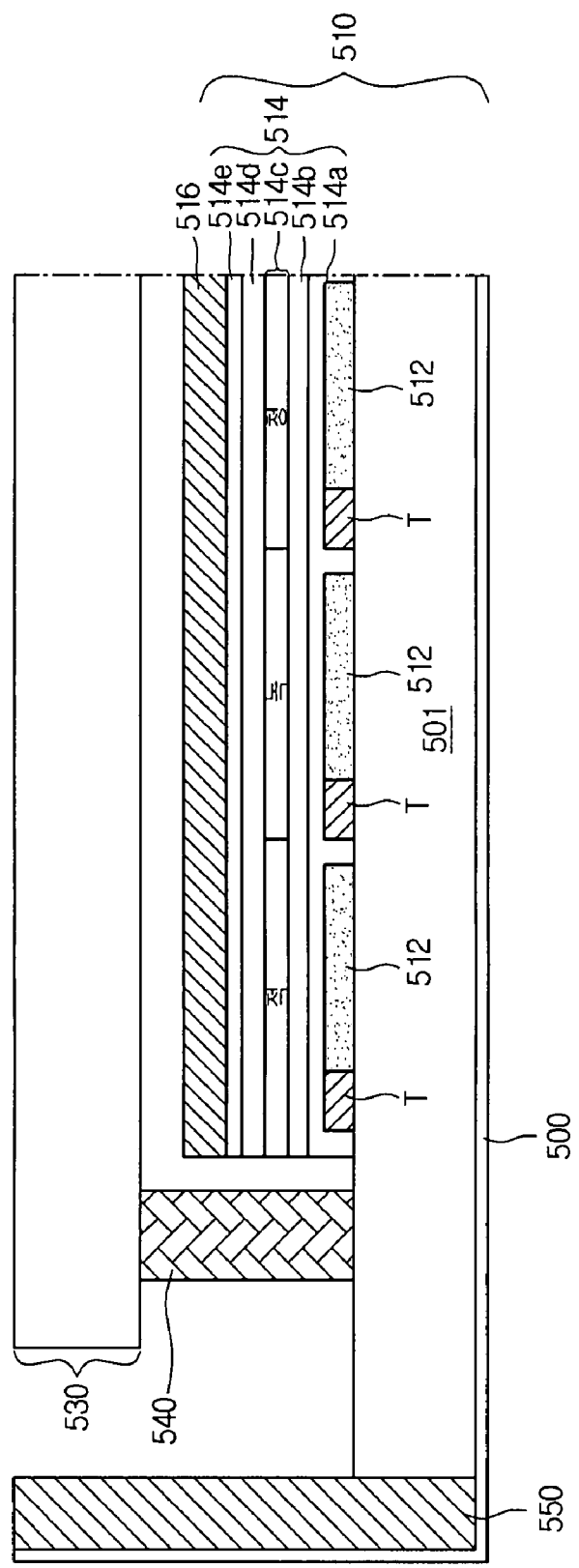
FIGS. 3A to 3D are sectional views illustrating a method of fabricating an organic electroluminescent device according to another embodiment of the present invention.

Referring to FIG. 3A, first and second substrates 510 and 530 are arranged to face each other. A thin film transistor T and a first electrode 512 are formed on a transparent substrate 501 of the first substrate 510 in each sub pixel. An organic electroluminescent layer 514 exhibiting red, green and blue color is formed on the thin film transistor T and the first electrode 512. A second electrode 516 is formed on the organic electroluminescent layer 514. The first and second electrodes 512 and 516 playing a role in applying an electric field to the organic electroluminescent layer 514. The organic electroluminescent layer 514 includes a hole injection layer 514a, a hole transporting layer 514b, an emission layer 514c, an electron transporting layer 514d, and electron injection layer 514e, which are sequentially formed on the first electrode 512.

The organic electroluminescent layer formed in each sub pixel unit may be structured such that R, G and B organic electroluminescent layers are stacked to generate white light. In case of the stacked structure of R, G and B organic electroluminescent layers, R, G and B color filters may be further formed on the second substrate 530 in each sub pixel unit. Also, the organic electroluminescent layer may be formed as a single layered white organic electroluminescent layer. In this case, R, G and B color filters may also be further formed on the second substrate 530 in each sub pixel unit. That is, the organic electroluminescent device of the present embodiment may be configured such that the first substrate 510 includes the thin film transistor Tr and the organic electroluminescent layer, and the second substrate 530 includes a color filter.

The first substrate 510 with the organic electroluminescent layer 514 formed is attached to the second substrate 530 by a seal 540. The width of the transparent substrate 501 of the first substrate 510 is greater than that of the second substrate 530. Alternatively, the second substrate 530 may have a greater width than the first substrate 510. This is accomplished during a cutting process after the attachment process of the substrates.

After attaching the first and second substrates 510 and 530, a supporter 500 is attached to a rear surface of the transparent substrate 501 of the first substrate 510, and a guide member 550 is additionally attached to edges at both sides of the first and second substrates 510 and 530. Though only an edge region at one side of the first and second substrates 510 and 530 is illustrated in the drawings, an edge region at the other side also has the same configuration as the edge region at one side of the first and second substrates 510 and 530.

Figure 3B:
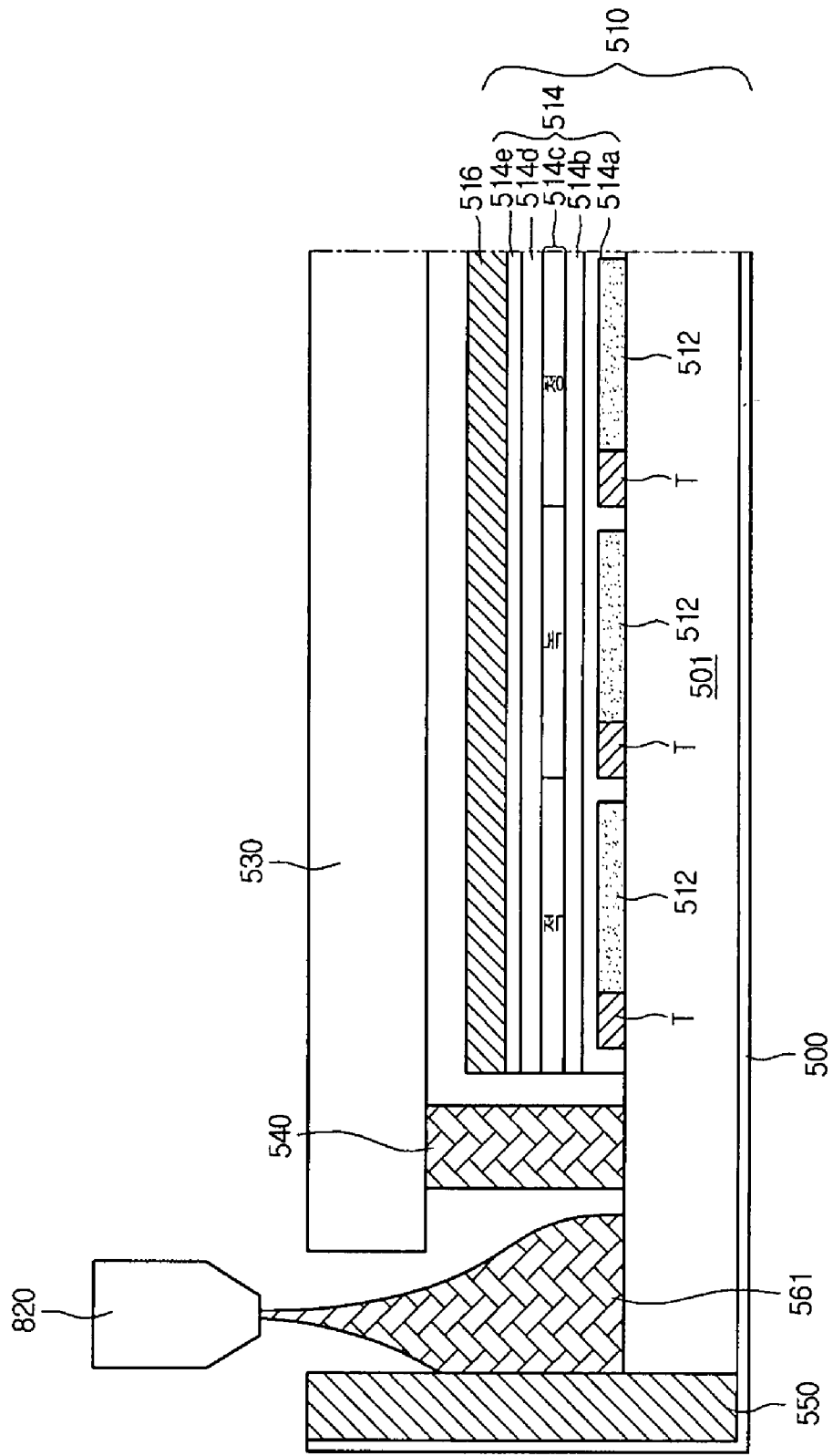
Figure 3C:
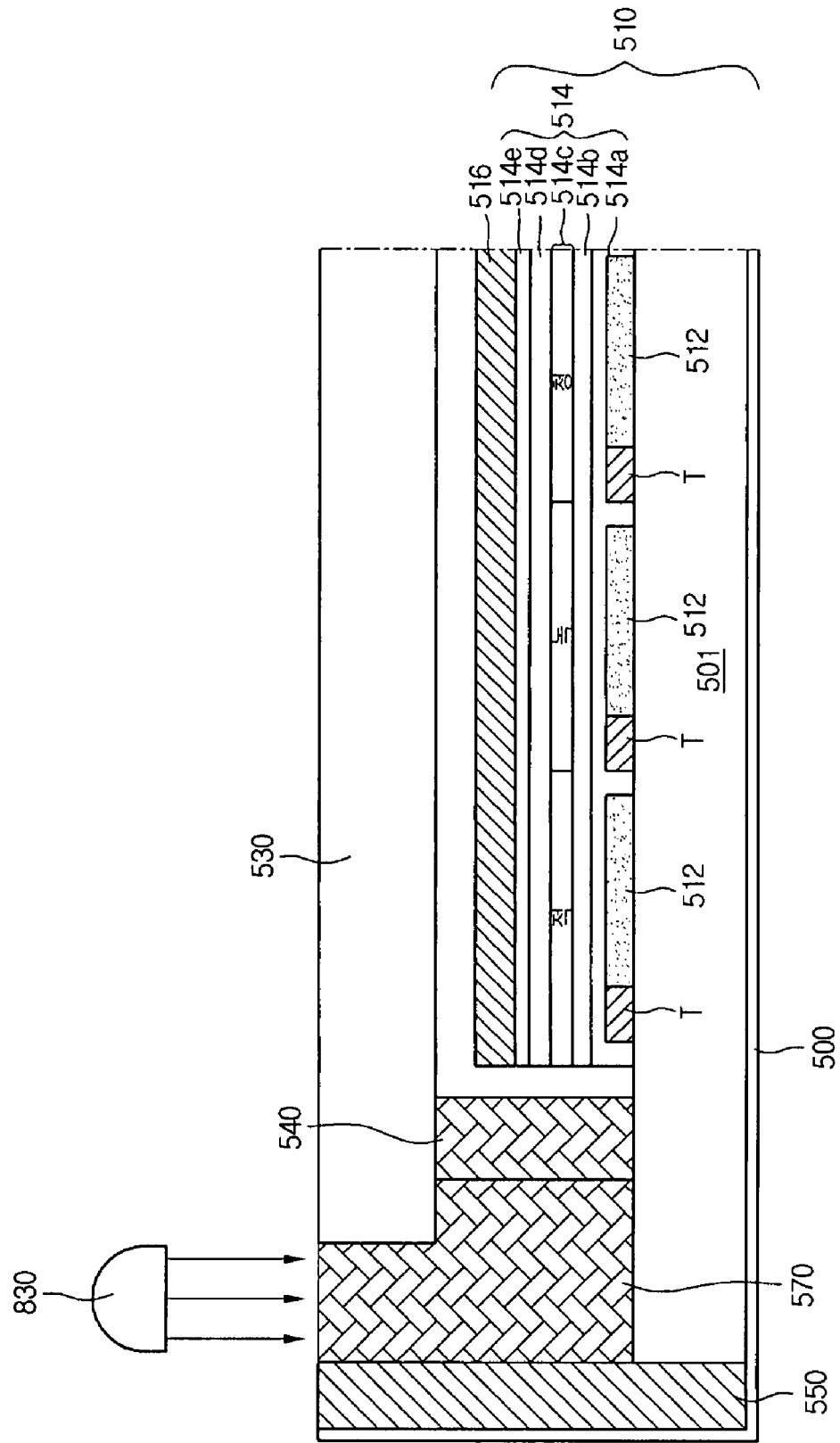
Figure 3D:
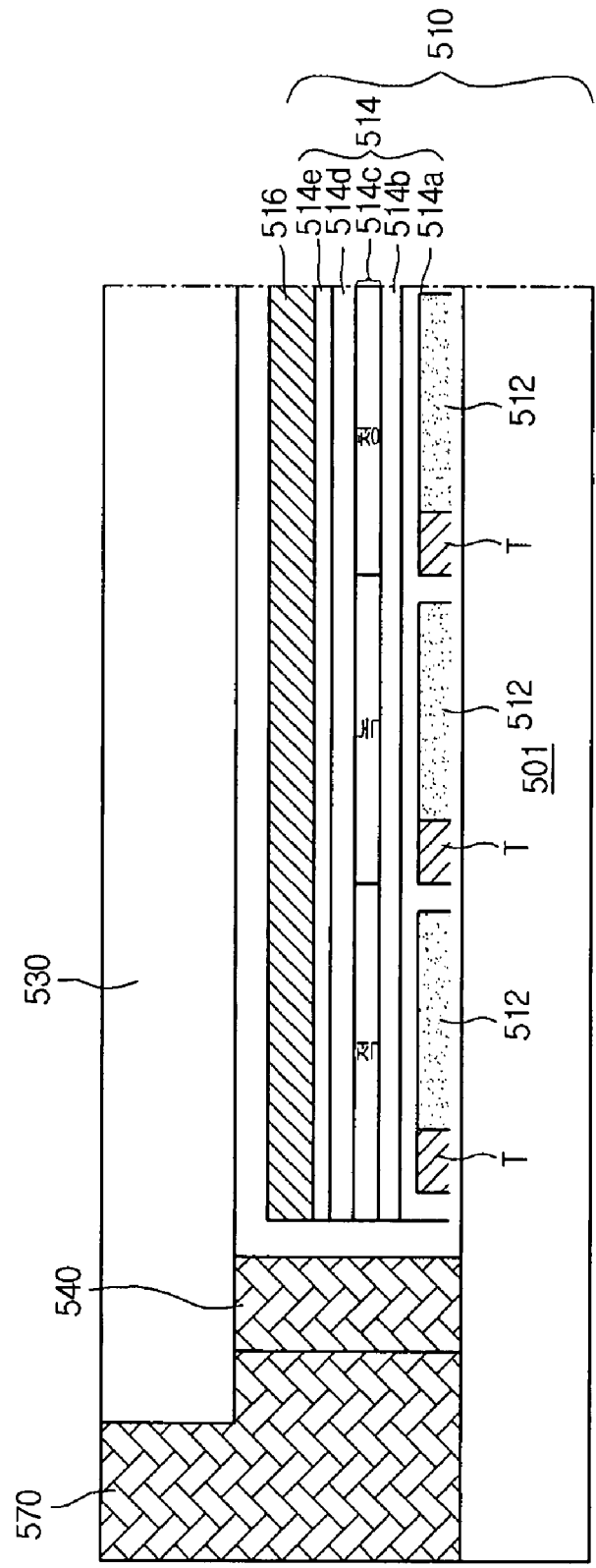

Thereafter, referring to FIGS. 3B and 3C, a dispenser 820 is positioned at locations corresponding to the edge regions at both sides of the first and second substrate 510 and 530, and a sealant 561 is then coated on the substrate.

Examples of a material that may be used as the sealant 561 include silicon-based inorganic material, metal oxide, and UV curing agent.

After coating the sealant 561, a UV irradiator 830 is positioned at locations corresponding to the edge regions at both sides of the attached first and second substrate 510 and 530, and a curing process is performed to form a second seal line 570. The second seal line 570 plays a role in sealing off the attached first and second substrates 510 and 530 at both edges thereof.

When using the UV irradiator 830, a mask may be used such that UV light is irradiated onto only the edge regions at both sides of the attached first and second substrates 510 and 530.

In addition, when the material for the second seal line 570 is an inorganic material, the curing process may be performed using a beam heater or a laser.

After forming the second seal line 570 as described above, referring to FIG. 3D, the supporter 500 and the guide member 550 are removed to complete the organic electroluminescent device.

Also, the dual seal lines are employed when attaching the upper and lower substrates to each other so that it is possible to minimize the penetration of external moisture or the decrease of degree of vacuum inside the substrate, which results in improving device characteristics. Moreover, it is unnecessary to additionally form a bezel region on the edge regions at both sides of the attached upper and lower substrates in virtue of the dual seal lines.

As described in detail above, an organic electroluminescent of the present invention device prevents the penetration of external moisture and foreign substance by dually forming seal lines of which one is used for attaching upper and lower substrates and the other is used for closing off edge regions at both sides of the attached upper and lower substrates from the outside.

Also, according to the organic electroluminescent device of the present invention, dual seals can be formed without modification of bezel region by attaching upper and lower substrates of the organic electroluminescent device by means of a first seal line, removing a portion of edges at both sides of one of the attached upper and lower substrates, and forming a second seal line on edges at both sides of the attached upper and lower substrates.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating an organic electroluminescent device, the method comprising:
    providing a first substrate, wherein a thin film transistor is formed on the first substrate;
    providing a second substrate, wherein an organic electroluminescent layer is formed on the second substrate;
    coating a first sealant on one of the first and second substrates, and attaching the first and second substrates to each other to form a first seal line; and
    forming a second seal line on edge regions at both sides of the attached first and second substrates where the first seal line is formed,
    wherein the forming of the second seal line includes,
    attaching a supporter to the first and second substrates attached by the first seal line;
    coating a second sealant on the edge regions at both sides of the attached first and second substrates;
    curing a region where the second sealant is coated, and
    wherein the attaching of the supporter further comprises attaching a guide member to edge regions of the first and second substrates, and
    wherein the guide member is attached on the supporter in the edge regions of the first and second substrates.

2. The method according to claim 1, wherein the curing of the region where the second sealant is coated further comprises removing the supporter.

3. The method according to claim 1, wherein the curing of the region where the second sealant is coated further comprises removing the guide member.

4. The method according to claim 1, wherein the curing of the region where the second sealant is coated is performed using any one of UV irradiation, heating and laser irradiation.

5. The method according to claim 1, wherein the second seal line is any one of ultraviolet curing agent, silicon and metal oxide.

6. The method according to claim 1, wherein the organic electroluminescent layer is formed as a stacked structure of red, green and blue organic electroluminescent layers, or formed as a white organic electroluminescent layer.

7. The method according to claim 6, further comprising forming red, green and blue color filters on the first substrate.

* * * * *